US008546248B2

(12) United States Patent
Chung et al.

(10) Patent No.: US 8,546,248 B2
(45) Date of Patent: Oct. 1, 2013

(54) METHOD OF FORMING POLYCRYSTALLINE SILICON LAYER AND ATOMIC LAYER DEPOSITION APPARATUS USED FOR THE SAME

(75) Inventors: Yun-Mo Chung, Yongin (KR); Ki-Yong Lee, Yongin (KR); Min-Jae Jeong, Yongin (KR); Jin-Wook Seo, Yongin (KR); Jong-Won Hong, Yongin (KR); Heung-Yeol Na, Yongin (KR); Eu-Gene Kang, Yongin (KR); Seok-Rak Chang, Yongin (KR); Tae-Hoon Yang, Yongin (KR); Ji-Su Ahn, Yongin (KR); Young-Dae Kim, Yongin (KR); Byoung-Keon Park, Yongin (KR); Kil-Won Lee, Yongin (KR); Dong-Hyun Lee, Yongin (KR); Sang-Yon Yoon, Yongin (KR); Jong-Ryuk Park, Yongin (KR); Bo-Kyung Choi, Yongin (KR); Maxim Lisachenko, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 181 days.

(21) Appl. No.: 13/177,936

(22) Filed: Jul. 7, 2011
(Under 37 CFR 1.47)

(65) Prior Publication Data

US 2011/0263107 A1    Oct. 27, 2011

Related U.S. Application Data

(62) Division of application No. 12/714,252, filed on Feb. 26, 2010, now Pat. No. 8,048,783.

(30) Foreign Application Priority Data

Mar. 5, 2009    (KR) .................. 10-2009-0018927

(51) Int. Cl.
*H01L 21/20*    (2006.01)

(52) U.S. Cl.
USPC .................. 438/486; 438/795; 257/E21.297

(58) Field of Classification Search
USPC .................. 438/502, 944, 948; 257/E21.297, 257/E21.317
See application file for complete search history.

(56) References Cited

U.S. PATENT DOCUMENTS

| 5,517,037 A | 5/1996 | Yamamoto |
| 5,814,540 A | 9/1998 | Takemura et al. |

(Continued)

FOREIGN PATENT DOCUMENTS

| CN | 1779985 | 5/2006 |
| EP | 1903604 A2 | 3/2008 |

(Continued)

OTHER PUBLICATIONS

Final Office Action of U.S. Appl. No. 12/714,201 dated Jan. 17, 2013.

(Continued)

*Primary Examiner* — Cheung Lee
(74) *Attorney, Agent, or Firm* — H. C. Park & Associates, PLC

(57) ABSTRACT

A method of forming a polycrystalline silicon layer and an atomic layer deposition apparatus used for the same. The method includes forming an amorphous silicon layer on a substrate, exposing the substrate having the amorphous silicon layer to a hydrophilic or hydrophobic gas atmosphere, placing a mask having at least one open and at least one closed portion over the amorphous silicon layer, irradiating UV light toward the amorphous silicon layer and the mask using a UV lamp, depositing a crystallization-inducing metal on the amorphous silicon layer, and annealing the substrate to crystallize the amorphous silicon layer into a polycrystalline silicon layer. This method and apparatus provide for controlling the seed position and grain size in the formation of a polycrystalline silicon layer.

7 Claims, 3 Drawing Sheets

(56) References Cited

U.S. PATENT DOCUMENTS

| | | | |
|---|---|---|---|
| 5,818,083 | A | 10/1998 | Ito |
| 6,198,133 | B1 | 3/2001 | Yamazaki et al. |
| 6,294,442 | B1 | 9/2001 | Kamal |
| 6,294,815 | B1 | 9/2001 | Yamazaki et al. |
| 6,806,099 | B2 | 10/2004 | Takeda et al. |
| 6,812,473 | B1 | 11/2004 | Amemiya |
| 6,927,107 | B1 | 8/2005 | Makita et al. |
| 7,015,501 | B2 | 3/2006 | Redecker et al. |
| 7,091,519 | B2 | 8/2006 | Yamazaki et al. |
| 7,341,907 | B2 | 3/2008 | Li et al. |
| 7,615,421 | B2 | 11/2009 | Lee et al. |
| 7,618,852 | B2 | 11/2009 | Jang et al. |
| 2001/0003659 | A1 | 6/2001 | Aya et al. |
| 2002/0063261 | A1 | 5/2002 | Zhang |
| 2003/0080337 | A1 | 5/2003 | Yudasaka et al. |
| 2004/0115906 | A1 | 6/2004 | Makita et al. |
| 2004/0173796 | A1 | 9/2004 | Miyasaka |
| 2005/0023531 | A1 | 2/2005 | Shoji et al. |
| 2005/0161742 | A1 | 7/2005 | Isobe et al. |
| 2005/0184290 | A1 | 8/2005 | Ohnuma |
| 2005/0275019 | A1 | 12/2005 | Seo et al. |
| 2006/0040429 | A1 | 2/2006 | Park et al. |
| 2006/0051914 | A1 | 3/2006 | Kakehata et al. |
| 2006/0061266 | A1 | 3/2006 | Kang et al. |
| 2006/0121651 | A1 | 6/2006 | Park et al. |
| 2006/0130939 | A1 | 6/2006 | Jang et al. |
| 2008/0147083 | A1 | 6/2008 | Vold et al. |
| 2008/0157083 | A1 | 7/2008 | Park et al. |
| 2008/0211024 | A1 | 9/2008 | Kato et al. |
| 2008/0258186 | A1 | 10/2008 | Surdeanu et al. |
| 2009/0050894 | A1 | 2/2009 | Park et al. |
| 2009/0239352 | A1 | 9/2009 | Kitagawa et al. |

FOREIGN PATENT DOCUMENTS

| | | |
|---|---|---|
| EP | 2226833 A1 | 9/2010 |
| JP | 63-033868 | 2/1988 |
| JP | 63-304668 | 12/1988 |
| JP | 05-173177 | 7/1993 |
| JP | 06-067203 | 3/1994 |
| JP | 06-260651 | 9/1994 |
| JP | 07-013196 | 1/1995 |
| JP | 08-045850 | 2/1996 |
| JP | 2001-189275 | 7/2001 |
| JP | 2001-337348 | 12/2001 |
| JP | 2003-060209 | 2/2003 |
| JP | 2003-100629 | 4/2003 |
| JP | 2004-207298 | 7/2004 |
| JP | 2005-064487 | 3/2005 |
| JP | 2005-229096 | 8/2005 |
| JP | 2005-354028 | 12/2005 |
| JP | 2006-019682 | 1/2006 |
| JP | 2006-330736 | 12/2006 |
| JP | 2007-013145 | 1/2007 |
| JP | 2007-073953 | 3/2007 |
| JP | 2007-311767 | 11/2007 |
| JP | 2008-166698 | 7/2008 |
| JP | 2008-166703 | 7/2008 |
| JP | 2008-166785 | 7/2008 |
| KR | 10-1992-0006076 | 7/1992 |
| KR | 10-1997-0063763 | 9/1997 |
| KR | 10-1997-0072491 | 11/1997 |
| KR | 10-2000-0055877 | 9/2000 |
| KR | 10-0285865 | 3/2001 |
| KR | 10-2001-0078788 | 8/2001 |
| KR | 10-0317638 | 12/2001 |
| KR | 10-2002-0021546 | 3/2002 |
| KR | 10-2003-0028696 | 4/2003 |
| KR | 10-2004-0036761 | 5/2004 |
| KR | 10-2004-0040762 | 5/2004 |
| KR | 10-2004-0098958 | 11/2004 |
| KR | 10-0470274 | 2/2005 |
| KR | 10-2006-0018533 | 3/2006 |
| KR | 10-2006-0058934 | 6/2006 |
| KR | 10-0623228 | 9/2006 |
| KR | 10-0628989 | 9/2006 |
| KR | 10-0772347 | 10/2007 |
| KR | 10-2007-0107142 | 11/2007 |
| KR | 10-2007-0107168 | 11/2007 |
| KR | 10-0778781 | 11/2007 |
| KR | 10-0839735 | 6/2008 |
| KR | 10-2008-0086967 | 9/2008 |

OTHER PUBLICATIONS

Non-Final Office Action issued for related U.S. Appl. No. 12/714,137 dated Dec. 19, 2011.
Non-Final Office Action issued for related U.S. Appl. No. 12/714,154 dated Dec. 23, 2011.
Non-Final Office Action issued for related U.S. Appl. No. 12/714,201 dated Jan. 13, 2012.
Non-Final Office Action of related U.S. Appl. No. 12/712,591 mailed on Feb. 28, 2013.
Non-Final Office Action of U.S. Appl. No. 12/713,928 dated on Mar. 28, 2012.
Final Office Action of U.S. Appl. No. 12/714,154 dated on Apr. 10, 2012.
Final Office Action of U.S. Appl. No. 12/714,137 dated on Mar. 22, 2012.
Final Office Action of U.S. Appl. No. 12/714,201 dated on Apr. 24, 2012.
Metal-induced crystallization of amorphous silicon, Thin Solid Film 338 (2001) 34-38, Soo Young et al.
S.L. Gras, et al., Intelligent Control of Surface Hydrophobicity, pp. 2036-2050, ChemphyChem, vol. 8, Oct. 2007, Wiley-VCH, Germany.
Co-pending U.S. Appl. No. 12/713,846, filed Feb. 26, 2010.
Co-pending U.S. Appl. No. 12/712,591, filed Feb. 25, 2010.
Co-pending U.S. Appl. No. 12/713,928, filed Feb. 26, 2010.
Co-pending U.S. Appl. No. 12/714,137 filed Feb. 26, 2010.
Co-pending U.S. Appl. No. 12/714,154, filed Feb. 26, 2010.
Co-pending U.S. Appl. No. 12/714,201, filed Feb. 26, 2010.
Final Office Action of U.S. Appl. No. 12/713,928 dated on Jul. 10, 2012.
Non-Final Office Action of related U.S. Appl. No. 12/713,846 issued Aug. 27, 2012.
Notice of Allowance of U.S. Appl. No. 12/714,252 issued on Aug. 30, 2011.
Final Office Action of U.S. Appl. No. 12/713,928 dated Sep. 20, 2012.
Non-Final Office Action of U.S. Appl. No. 12/714,201 dated Sep. 27, 2012.
Notice of Allowance of U.S. Appl. No. 12/713,846 dated on Dec. 14, 2012.
Non-Final Office Action issued on Jul. 5, 2013 in U.S. Appl. No. 12/714,154.
Final Office Action issued on Jul. 24, 2013 in U.S. Appl. No. 12/712,591.

METHOD OF FORMING POLYCRYSTALLINE SILICON LAYER AND ATOMIC LAYER DEPOSITION APPARATUS USED FOR THE SAME

CROSS-REFERENCE TO RELATED APPLICATION

This application is a divisional of U.S. patent application Ser. No. 12/714,252 filed on Feb. 26, 2010 and claims the benefit of Korean Patent Application No. 10-2009-0018927, filed Mar. 5, 2009 in the Korean Intellectual Property Office, the disclosure of which is incorporated herein by reference.

BACKGROUND OF THE INVENTION

1. Field of the Invention

Aspects of the present invention relate to a method of forming a polycrystalline silicon layer and an atomic layer deposition apparatus used for the same, and more particularly, to a method of forming a polycrystalline silicon layer and an atomic layer deposition apparatus in which a crystallization-inducing metal may be deposited on an amorphous silicon layer at a predetermined position and a uniform concentration by modifying a predetermined region of a surface of the amorphous silicon layer into a hydrophilic surface or a hydrophobic surface. Thus, seed position and grain size may be controlled.

2. Description of the Related Art

Generally, polycrystalline silicon layers are widely used as semiconductor layers for thin film transistors since the polycrystalline silicon layers have high field effect mobility, and enable application to high-speed operating circuits and formation of CMOS circuits. Thin film transistors using the polycrystalline silicon layers are mainly used for active devices of active-matrix liquid crystal display (AMLCD) devices, and switching and driving devices of organic light emitting diode (OLED) display devices.

Examples of methods of crystallizing amorphous silicon into polycrystalline silicon include solid phase crystallization (SPC), excimer laser crystallization (ELC), metal-induced crystallization (MIC) and metal-induced lateral crystallization (MILC) methods. In the SPC method, an amorphous silicon layer is annealed for several to several tens of hours at a temperature of about 700° C. or less, which is the thermal deformation temperature of glass forming a substrate of a display device using a thin film transistor. In the ELC method, an excimer laser is applied to an amorphous silicon layer to locally heat the amorphous silicon layer for a very short period of time at high temperature. In the MIC method, a crystallization-inducing metal such as nickel, palladium, gold or aluminum is in contact with or injected into an amorphous silicon layer to induce a phase change into a polycrystalline silicon layer, and in the MILC method, a silicide produced by reacting a crystallization-inducing metal with silicon then laterally propagates, sequentially inducing crystallization of the amorphous silicon layer. However, the SPC method requires a long processing time, and easily causes deformation of a substrate due to long annealing at high temperature, and the ELC method requires high-priced laser equipment and has poor interface characteristics between the polycrystallized silicon semiconductor layer and a gate insulating layer due to protrusions occurring on the polycrystallized surface.

Today, research into methods of crystallizing an amorphous silicon layer using a crystallization-inducing metal has been widely conducted because of faster crystallization at a lower temperature than the SPC method. Examples of these crystallization methods using a crystallization-inducing metal include MIC, MILC, and super grain silicon (SGS) crystallization methods.

In the crystallization methods using a crystallization-inducing metal, the crystallization-inducing metal is deposited on an amorphous silicon layer by sputtering, ion implantation or thermal evaporation. However, in these methods, metal particles to be deposited randomly propagate from a metal target, and thus there is a limit in being able to uniformly deposit a metal catalyst to have a concentration as high as $10^{11}$ to $10^{16}$ atoms/cm². Recently, while a technique of uniformly depositing crystallization-inducing metals on an amorphous silicon layer using micro-electro-mechanical systems (MEMS) technology has been disclosed, this has disadvantages of length of preparation time in mass-production, which may not be suitable for commercialization.

SUMMARY OF THE INVENTION

Aspects of the present invention provide a method of forming a polycrystalline silicon layer and an atomic layer deposition apparatus used for the same, in which a crystallization-inducing metal is deposited on an amorphous silicon layer at a predetermined position and a uniform concentration, and thus the seed position and the grain size may be controlled.

According to an embodiment of the present invention, a method of forming a polycrystalline silicon layer includes: forming an amorphous silicon layer on a substrate; exposing the substrate having the amorphous silicon layer to a hydrophilic or hydrophobic gas atmosphere; placing a mask having an open and a closed portion on the amorphous silicon layer; irradiating UV light through the mask to the amorphous silicon layer using a UV lamp; depositing a crystallization-inducing metal on the amorphous silicon layer; and annealing the substrate to crystallize the amorphous silicon layer into a polycrystalline silicon layer. Hereafter, an open portion can be at least one open portion and a closed portion can be at least one closed portion.

According to another embodiment of the present invention, an atomic layer deposition apparatus includes: a chamber; a chuck disposed in the chamber; a mask disposed over the chuck and having an open and a closed portion; a UV lamp disposed on the mask; and a gas inlet disposed at a side of the chamber. Hereafter, a gas inlet can be at least one gas inlet and a side of the chamber can be at least one side of the chamber. Moreover, when a first element is said to be "disposed" on a second element, the first element can directly contact the second element, or can be separated from the second element by one or more other elements that can be located therebetween.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
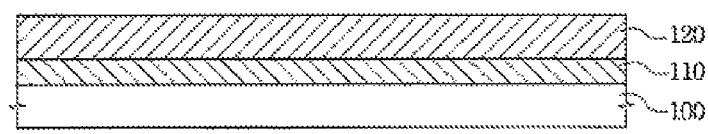
FIGS. 1A to 1D are cross-sectional views illustrating a method of forming a polycrystalline silicon layer according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1A to 1D are cross-sectional views illustrating a method of forming a polycrystalline silicon layer according to an exemplary embodiment of the present invention. Referring to FIG. 1A, a substrate 100 formed of glass or plastic is prepared. A buffer layer 110 may be formed on the substrate 100. The buffer layer 110 is formed of a single insulating layer including silicon dioxide or silicon nitride, or a multilayer thereof, by chemical vapor deposition (CVD) or physical vapor deposition (PVD). Here, the buffer layer 110 may prevent diffusion of moisture or impurities generated from the substrate 100, or control the heat transfer rate during crystallization to facilitate the crystallization of an amorphous silicon layer.

Subsequently, an amorphous silicon layer 120 is formed on the buffer layer 110. The amorphous silicon layer 120 is formed by CVD or PVD. During or after the formation of the amorphous silicon layer 120, a process for reducing the hydrogen concentration by dehydrogenation may be performed.

Figure 1B:
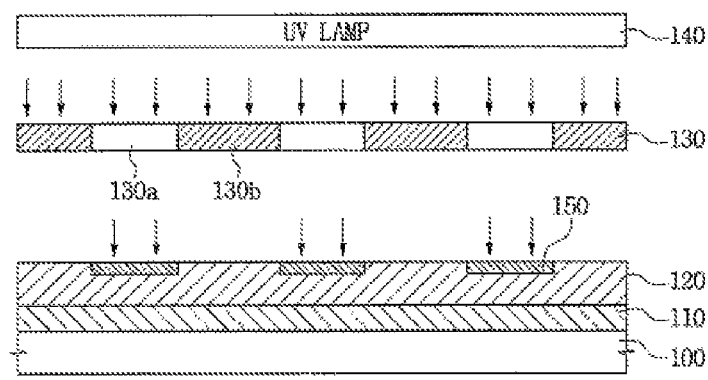

The substrate 100 having the amorphous silicon layer 120 is exposed to a hydrophilic or hydrophobic gas atmosphere. Referring to FIG. 1B, a mask 130 having an open portion 130a and a closed portion 130b is disposed on the amorphous silicon layer 120, and a UV lamp 140 is disposed above the mask 130. UV light is irradiated onto the amorphous silicon layer 120 through the open portion 130a of the mask 130 using the UV lamp. When UV light is irradiated from the UV lamp, a corresponding predetermined region 150 on the surface of the amorphous silicon layer 120, upon which UV light is irradiated from the UV lamp, is modified into a hydrophilic or hydrophobic surface. Hereafter, an open portion can be at least one open portion and a closed portion can be at least one closed portion. Moreover, when a first element is said to be "disposed" on a second element, the first element can directly contact the second element, or can be separated from the second element by one or more other elements that can be located therebetween.

When the substrate 100 is exposed to a hydrophilic gas atmosphere, an open portion 130a of the mask corresponds to a region that the crystallization-inducing metal will be deposited on the amorphous silicon layer 120. When the substrate 100 is exposed to a hydrophobic gas atmosphere, a closed portion 130b of the mask corresponds to a region that the crystallization-inducing metal will be deposited on the amorphous silicon layer 120. The distance between the mask 130 and the UV lamp 120 may be within the range of distances over which the wavelength of the UV lamp can maintain linearity such that regions irradiated by UV light correspond to an open portion 130a of the mask. The distance may be changed according to the processing pressure, the wavelength of the UV lamp and the kind of the gas.

The hydrophilic gas may include $O_2$, $N_2O$ or $H_2O$, and the hydrophobic gas may include one or more of the series of gases $C_xF_y$ (where x and y are natural numbers). The wavelength of the UV lamp 120 may be a short wavelength (that is, Ultraviolet C or UVC). For efficiency, a vacuum UV lamp (VUV lamp) and an extreme UV lamp (EUV lamp) may be used. The VUV lamp is preferable.

Figure 1C:
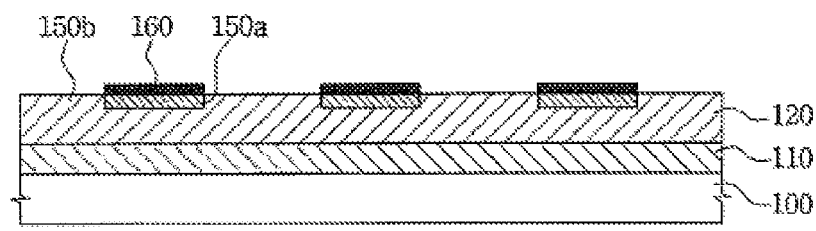
Figure 1D:
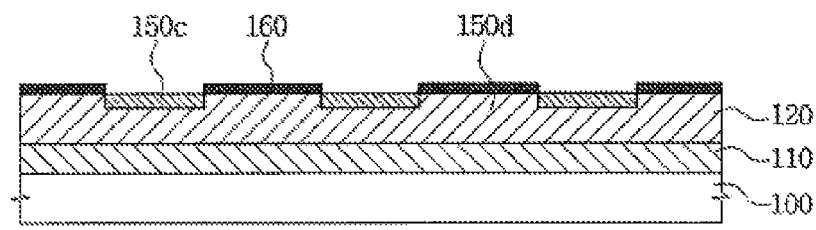

Then, a crystallization-inducing metal 160 is deposited on the amorphous silicon layer 120. Referring to FIG. 1C, the crystallization-inducing metal 160 is preferentially deposited on a predetermined region 150a of the amorphous silicon layer 120 modified into a hydrophilic surface. The crystallization-inducing metal 160 is not deposited on a predetermined region 150b of the surface of the amorphous silicon layer that is not modified into a hydrophilic surface. Conversely, referring to FIG. 1D, the crystallization-inducing metal 160 is not deposited on a predetermined region 150c of the surface of the amorphous silicon layer 120 that is modified into a hydrophobic surface, and preferentially deposited on a predetermined region 150d of the surface of the amorphous silicon layer that is not modified into a hydrophobic surface. Thus, the crystallization-inducing metal 160 may be disposed only on predetermined regions of the amorphous silicon layer 120, so that regions in which a crystallization seed will be formed may be controlled, and thereby the grain size may also be controlled.

The crystallization-inducing metal 160 may be one selected from the group consisting of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tb), rubidium (Ru), rhodium (Rh), cadmium (Cd) and platinum (Pt), and preferably Ni. The crystallization-inducing metal may be deposited to have an areal density of $10^{11}$ to $10^{15}$ atoms/cm$^2$. When the crystallization-inducing metal is deposited to have a density in the predetermined regions of less than $10^{11}$ atoms/cm$^2$, the amount of seeds, which are crystallization nuclei, may be too small so that it is difficult to crystallize the amorphous silicon layer into a polycrystalline silicon layer. When the crystallization-inducing metal is deposited to have a density in the predetermined regions of more than $10^{15}$ atoms/cm$^2$, the amount of the crystallization-inducing metals diffused to the amorphous silicon layer is large, so that leakage current characteristics of the semiconductor layer formed by patterning the polycrystalline silicon layer may be poor. The crystallization-inducing metal layer 160 may be deposited by CVD such as atomic layer deposition to ensure a uniform thickness and a low concentration.

Subsequently, the substrate 100 having the amorphous silicon layer 120 on which the crystallization-inducing metal 160 is deposited is annealed, thereby crystallizing the amorphous silicon layer 120 into a polycrystalline silicon layer. During annealing, the surface of the amorphous silicon layer 120 is modified into a hydrophilic surface or not modified into a hydrophobic surface, and thereby seeds are formed from the regions 150a and 150c on which the crystallization-inducing metals 160 are deposited, and grains are laterally grown about the regions. Thus, the position of an open portion 130a of the mask 130 controls the region in which the seeds are formed, and thereby the size of the crystal grains may be controlled.

The annealing process may be one of a furnace process, a rapid thermal annealing (RTA) process, a UV process and a laser process, and may be performed in the range from 200 to 900° C. for several seconds to hours. Over those temperatures and times, deformation of the substrate due to excessive annealing may be prevented, improved yield may be obtained, and production costs may be reduced.

In another embodiment of the present invention, the crystallization-inducing metal 160 may be deposited by atomic layer deposition. An atomic layer deposition apparatus used herein and a method of depositing a crystallization-inducing metal on an amorphous silicon layer using the same will be described. Except for additional descriptions below, these will be explained with reference to the descriptions of the previous exemplary embodiment.

Figure 2:
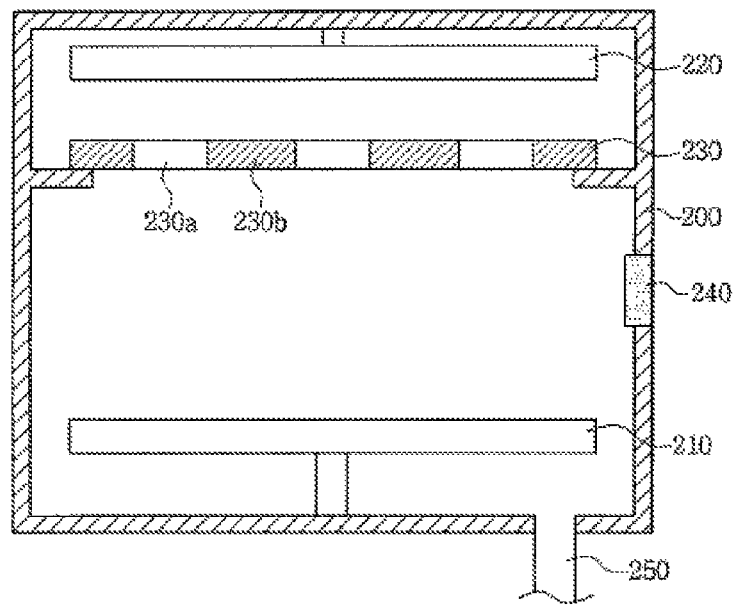
FIG. 2 is a cross-sectional view of an atomic layer deposition apparatus for the method of forming a polycrystalline silicon layer according to another exemplary embodiment of the present invention.
Figure 3:
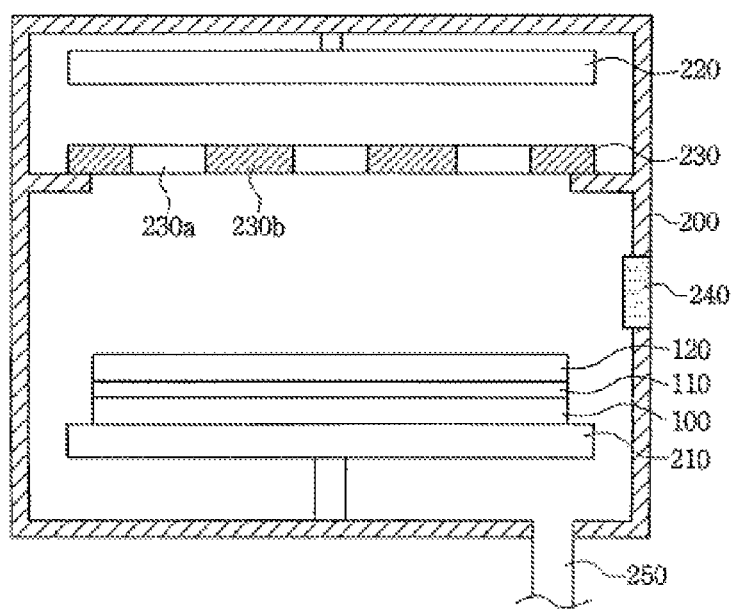
FIG. 3 is a cross-sectional view illustrating a method of forming a polycrystalline silicon layer using the atomic layer deposition apparatus of FIG. 2.

FIG. 2 is a cross-sectional view of an atomic layer deposition apparatus to be used for the method of forming a polycrystalline silicon layer according to an exemplary embodiment of the present invention. FIG. 3 is a cross-sectional view illustrating a method of forming a polycrystalline silicon layer using the atomic layer deposition apparatus of FIG. 2.

Referring to FIG. 2, the atomic layer deposition apparatus according to the exemplary embodiment of the present invention includes a chamber 200 having an internal space in which a deposition process is performed. A chuck 210 is disposed to load a substrate in the chamber 200. A UV lamp 220 is disposed on the chuck 210. A mask 230 having an open portion 230a and a closed portion 230b is disposed between the UV lamp 220 and the chuck 210. The wavelength of the UV lamp 220 may be a short wavelength (that is, Ultraviolet C or UVC). For efficiency, a VUV lamp or a EUV lamp may be used, and a VUV lamp is preferable.

At one side of the chamber 200, a gas inlet 240 is disposed to supply a gas to be used in the process. A plurality of gas inlets 240 may be disposed in the chamber 200 and may be disposed on one or more sides of the chamber 200. In addition, an exhaustion hole 250 for exhausting the used gases or residual products may be disposed under the chuck 210. A plurality of exhaustion holes 250 may also be disposed in the chamber 200.

Referring to FIG. 3, as shown in FIG. 1A, the substrate 100 having the amorphous silicon layer 120 is loaded on the chuck 210 in the chamber 200. Subsequently, UV light is irradiated from the UV lamp 220, and a hydrophilic or hydrophobic gas is provided from a gas inlet 240.

When a hydrophilic gas is provided, an open portion 230a of the mask 230 corresponds to a region where the crystallization-inducing metal will be deposited on the amorphous silicon layer 120. When a hydrophobic gas is provided, a closed portion 230b of the mask 230 corresponds to a region that the crystallization-inducing metal will be deposited on the amorphous silicon layer 120. The distance between the mask 230 and the UV lamp 220 may be within the range of distances over which the wavelength of the UV lamp may maintain linearity such that a region on which UV light is irradiated from the UV lamp corresponds to an open portion 230a of the mask 230. The distance may be changed depending on the processing pressure, the wavelength of the UV lamp and the kind of the gas. The hydrophilic gas may include $O_2$, $N_2O$ or $H_2O$, and the hydrophobic gas may include one or more of the series of gases, $C_xF_y$ (where x and y are natural numbers).

As shown in FIG. 1C, a crystallization-inducing metal 160 is deposited on the amorphous silicon layer 120 by supplying a crystallization-inducing metal precursor through a gas inlet 240. During supply of the crystallization-inducing metal precursor, the crystallization-inducing metal 160 is preferentially deposited on a predetermined region 150a of the amorphous silicon layer 120 that is modified into a hydrophilic surface. The crystallization-inducing metal 160 is not deposited on a predetermined region 150b of the surface of the amorphous silicon layer 120 that is not modified into a hydrophilic surface. Conversely, referring to FIG. 1D, the crystallization-inducing metal 160 is not deposited on a predetermined region 150c of the surface of the amorphous silicon layer 120 that is modified into a hydrophobic surface, and preferentially deposited on a predetermined region 150d of the surface of the amorphous silicon layer 120 that is not modified into a hydrophobic surface. Thus, the crystallization-inducing metal 160 may be disposed only on predetermined regions 150a and 150d of the amorphous silicon layer 120, so that regions in which crystallization seeds will be formed may be controlled, and thereby the grain size may also be controlled.

The crystallization-inducing metal 160 may be one selected from the group consisting of Ni, Pd, Ti, Ag, Au, Al, Sn, Sb, Cu, Co, Mo, Tb, Ru, Rh, Cd and Pt, and preferably Ni. The crystallization-inducing metal layer may be deposited to have an areal density of $10^{11}$ to $10^{15}$ atoms/cm$^2$. When the crystallization-inducing metal is deposited to have an areal density less than $10^{11}$ atoms/cm$^2$, an amount of seeds, which are crystallization nuclei, may be too small so that it is difficult to crystallize the amorphous silicon layer 120 into a polycrystalline silicon layer, and when the crystallization-inducing metal 160 is deposited to have an areal density more than $10^{15}$ atoms/cm$^2$, an amount of the crystallization-inducing metals diffused to the amorphous silicon layer 120 is large so that leakage current characteristics of the semiconductor layer formed by patterning the polycrystalline silicon layer may be poor.

The substrate 100 is unloaded from the atomic layer deposition apparatus, and the substrate 100 having the amorphous silicon layer 120 on which crystallization-inducing metals are deposited is annealed, and thereby the amorphous silicon layer 120 is crystallized into a polycrystalline silicon layer.

Thus, a crystallization-inducing metal can be deposited at predetermined positions on an amorphous silicon layer by modifying predetermined regions of a surface of the amorphous silicon layer into a hydrophilic or hydrophobic surface, and the crystallization-inducing metal can be deposited using an atomic layer deposition apparatus to have a uniform concentration, thereby controlling the seed position and the grain size to form a polycrystalline silicon layer. In addition, a thin film transistor can be formed using the polycrystalline silicon layer, so that the characteristic distribution of the thin film transistor, which occurs due to the non-uniform size of the grain, can be minimized.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a polycrystalline silicon layer, comprising:
    forming an amorphous silicon layer on a substrate;
    exposing the substrate having the amorphous silicon layer to a hydrophobic gas atmosphere;
    placing a mask having an open portion and a closed portion over the amorphous silicon layer;
    irradiating UV light at the amorphous silicon layer through the open portion of the mask using a UV lamp;
    depositing a crystallization-inducing metal on the amorphous silicon layer; and
    annealing the substrate to crystallize the amorphous silicon layer into a polycrystalline silicon layer.

2. The method according to claim 1, wherein a closed portion of the mask corresponds to a region in which the crystallization-inducing metal will be deposited on the amorphous silicon layer.

3. The method according to claim 1, wherein the crystallization-inducing metal is deposited only on a region of the amorphous silicon layer masked from the UV light because of a closed portion of the mask.

4. The method according to claim 1, wherein the hydrophobic gas is at least one of the series of gases $C_xF_y$ (where x and y are natural numbers).

5. The method according to claim 1, wherein the crystallization-inducing metal is deposited by atomic layer deposition.

6. The method according to claim 1, wherein the distance between the mask and the UV lamp is within the range of distances over which the wavelength of the UV lamp maintains linearity.

7. A method of making a thin film transistor comprising a polycrystalline silicon layer, the method comprising:
   forming an amorphous silicon layer on a substrate;
   exposing the substrate having the amorphous silicon layer to a hydrophobic gas atmosphere;
   placing a mask having an open portion and a closed portion over the amorphous silicon layer;
   irradiating UV light at the amorphous silicon layer through the open portion of the mask using a UV lamp;
   depositing a crystallization-inducing metal on the amorphous silicon layer; and
   annealing the substrate to crystallize the amorphous silicon layer into a polycrystalline silicon layer.

* * * * *